US012719369B2

(12) United States Patent
Yano

(10) Patent No.: US 12,719,369 B2
(45) Date of Patent: Aug. 25, 2026

(54) MULTI-DIE MODULE, A POWER SUPPLY

(71) Applicant: LAPIS Technology Co., Ltd., Yokohama (JP)

(72) Inventor: Yoshinori Yano, Yokohama (JP)

(73) Assignee: LAPIS TECHNOLOGY CO., LTD., Yokohama (JP)

(*) Notice: Subject to any disclaimer, the term of this patent is extended or adjusted under 35 U.S.C. 154(b) by 155 days.

(21) Appl. No.: 18/897,998

(22) Filed: Sep. 26, 2024

(65) Prior Publication Data

US 2025/0112555 A1 Apr. 3, 2025

(30) Foreign Application Priority Data

Sep. 29, 2023 (JP) ................................ 2023-170852

(51) Int. Cl.
*H02M 3/158* (2006.01)
*H02M 7/00* (2006.01)
*H10W 90/00* (2026.01)

(52) U.S. Cl.
CPC ........... *H02M 3/158* (2013.01); *H02M 7/003* (2013.01); *H10W 90/00* (2026.01)

(58) Field of Classification Search
CPC ...... H02M 3/158; H02M 7/003; H10W 90/00
See application file for complete search history.

(56) References Cited

U.S. PATENT DOCUMENTS

2007/0057658 A1 3/2007 Hasegawa
2015/0041955 A1* 2/2015 Zerbe ..................... H01G 4/228 257/532
2020/0066677 A1* 2/2020 Bhagavat ................ G06F 1/189

FOREIGN PATENT DOCUMENTS

JP 2007-082273 A 3/2007

* cited by examiner

*Primary Examiner* — Kyle J Moody
(74) *Attorney, Agent, or Firm* — Rabin & Berdo. P. C

(57) ABSTRACT

A multi-die module includes: a first semiconductor die having an internal line, an external electrode, and multiple internal electrodes and including a first control circuit that control a DC-DC converter; a second semiconductor die having multiple internal electrodes and including a second control circuit that controls a linear regulator; and a package that supports the first and second semiconductor dies. The second control circuit includes a voltage comparison circuit having a feedback input, a reference input, and a comparison output. In each of the first and second semiconductor dies, the multiple internal electrodes includes a first internal electrode. The feedback input of the voltage comparison circuit is connected to the first internal electrode of the second semiconductor die, which is connected to the first internal electrode of the first semiconductor die. The internal line connects the first internal electrode of the first semiconductor die to the external electrode.

20 Claims, 7 Drawing Sheets

11
13
17
15
20
12b
12c
12d
13d
13c
50
NDV
52
SIN
SFB
SFDB
SDRV1
SDRV2
21
21b
21c
29
31
31c
SCNT1
SCNT2
43
SBDR
41
VREF
CLK
SLCT
33
35
35b
35c
23
25

11a(11)
17
15
23
23f
25
23b
25b
25f
23d
SFDB
23c
25c
25d
10a
57
20
13
16f
(15b)
16h
(15b)
16d(15b)
16g(15b)
16b(15b)
16c(15b)
14f
(13b)
14h
(13b)
14d
(13b)
14g(13b)
14b(13b)
14c(13b)
12c
12b
53
S
G
B
D
33
33b
VREF
12f
SDRV1
MPO
21f
13d
CLK
21h
21d
SFB
13c
NCM1
41f
21
51
21g
41b
41d
55
43
43b
29c
29d
21b
SDRV1
12g
29b
41
29
SDRV2
MNO
SLCT
SCNT1
50
SBDR
29f
21c
SDRV2
NDV
35c
43d
31b
41c
41g
43c
SCNT2
31c
31
30
35b
VREF
31f
52
35
12d
SIN

11b(11)
17
15
23f
23
25
23b
25b
25f
23d
SFDB
23c
25c
25d
10b
20
13
16f
(15b)
16h
(15b)
16d(15b)
16g(15b)
16b(15b)
16c(15b)
57
53
S
14f
(13b)
14h
(13b)
14d
(13b)
33
14g(13b)
14c(13b)
12c
12b
33b
VREF
14b(13b)
G
B
D
12f
SDRV1
MPO
21f
13d
CLK
21h
21d
SFB
13c
NCM1
41f
51
21
41b
21g
41d
29c
43
43b
29b
29d
21b
SDRV1
12g
C
54
A
41
29
SCNT1
50
SBDR
SDRV2
NDV
43d
29f
21c
35c
SLCT
31b
41c
SCNT2
31c
41g
43c
31
30
35b
VREF
31f
52
35
12d
SIN

11c(11)
10c
17
15
23
23b
23c
23d
23f
25
25b
25c
25d
25f
SFDB
16f
(15b)
16h
(15b)
16d(15b)
16g(15b)
16b(15b)
16c(15b)
14f
(13b)
14h
(13b)
14d
(13b)
14g(13b)
14b(13b)
14c(13b)
20
13
12b
12c
12f
12g
12d
13c
13d
59
S
G
B
D
SDRV1
(SFDB)
MPO
33
33b
VREF
21f
CLK
21h
21d
SFB
41f
41b
41d
21g
41
21
29c
29b
29d
21b
SDRV1
43
43b
29
SCNT1
SBDR
43d
41c
41g
43c
29f
21c
SDRV2
31b
SCNT2
31c
31
31f
VREF
SLCT
35c
35
35b
50
NDV
52
51
30
SIN 10e
11e(11)
13
15
17
20
21
23
25
29
30
31
33
35
41
43
47
49
50
51
52
12b
12c
12d
12e
13c
13d
14b(13b)
14c(13b)
14d (13b)
14f (13b)
14g(13b)
14h (13b)
16b(15b)
16c(15b)
16d(15b)
16f (15b)
16g(15b)
16h (15b)
MP1
OFF
SDRV1
(SFDB)
SDRV2
SFDB
SFB
SCNT1
SCNT2
SBDR
SLCT
SIN
NDV
VREF
CLK

MULTI-DIE MODULE, A POWER SUPPLY

CROSS-REFERENCE TO RELATED APPLICATION

This application is based on and claims priority under 35 USC 119 from Japanese Patent Application to Japanese Patent Application No. 2023-170852 filed on Sep. 29, 2023, the disclosure of which are incorporated herein by reference.

BACKGROUND

Technical Field

The present disclosure relates to a multi-die module and a power supply device.

Related Art

Japanese Patent Application Laid-Open (JP-A) No 2007-82273 discloses operating a DC-DC converter as a switching regulator or a linear regulator.

In micro controller units (hereinafter referred to as MCUs or MCU), some of them each mount multiple regulators to form a single chip (die). One of the regulators includes a DC-DC converter circuit and another includes a linear regulator circuit. Integrating multiple regulators with the MCU can satisfy user demands, while the integration increases the chip size and the testing cost. A large chip area is unlikely to enhance yield in the wafer process (front-end process). Furthermore, in testing the multiple regulators mounted to form a single large die, if the test finds the large die defective, this prevents the reduction in testing costs.

What is needed is to provide a multi-die module that are equipped with a part or all of multiple regulators, and a power supply device including the multi-die module.

SUMMARY

A multi-die module according to the first aspect of the disclosure includes: a first semiconductor die having an internal line, an external electrode, and multiple internal electrodes, and including a first control circuit configured to control at least a DC-DC converter; a second semiconductor die having multiple internal electrodes, and including a second control circuit configured to control at least a linear regulator; and a package that supports the first and second semiconductor dies such that at least the first and second semiconductor dies form a multi-die module, wherein the first control circuit has a reference input and one or more outputs, wherein the second control circuit includes a voltage comparison circuit having a feedback input, a reference input, and a comparison output, wherein the multiple internal electrodes of the first semiconductor die includes a first internal electrode, wherein the multiple internal electrodes of the second semiconductor die includes a first internal electrode, wherein the feedback input of the voltage comparison circuit is connected to the first internal electrode of the second semiconductor die, wherein the first internal electrode of the first semiconductor die is connected to the first internal electrode of the second semiconductor die, and wherein the internal line connects the first internal electrode of the first semiconductor die to the external electrode.

BRIEF DESCRIPTION OF THE DRAWINGS

Exemplary embodiments of the present disclosure will be described in detail based on the following figures, wherein.

DETAILED DESCRIPTION

Figure 1:
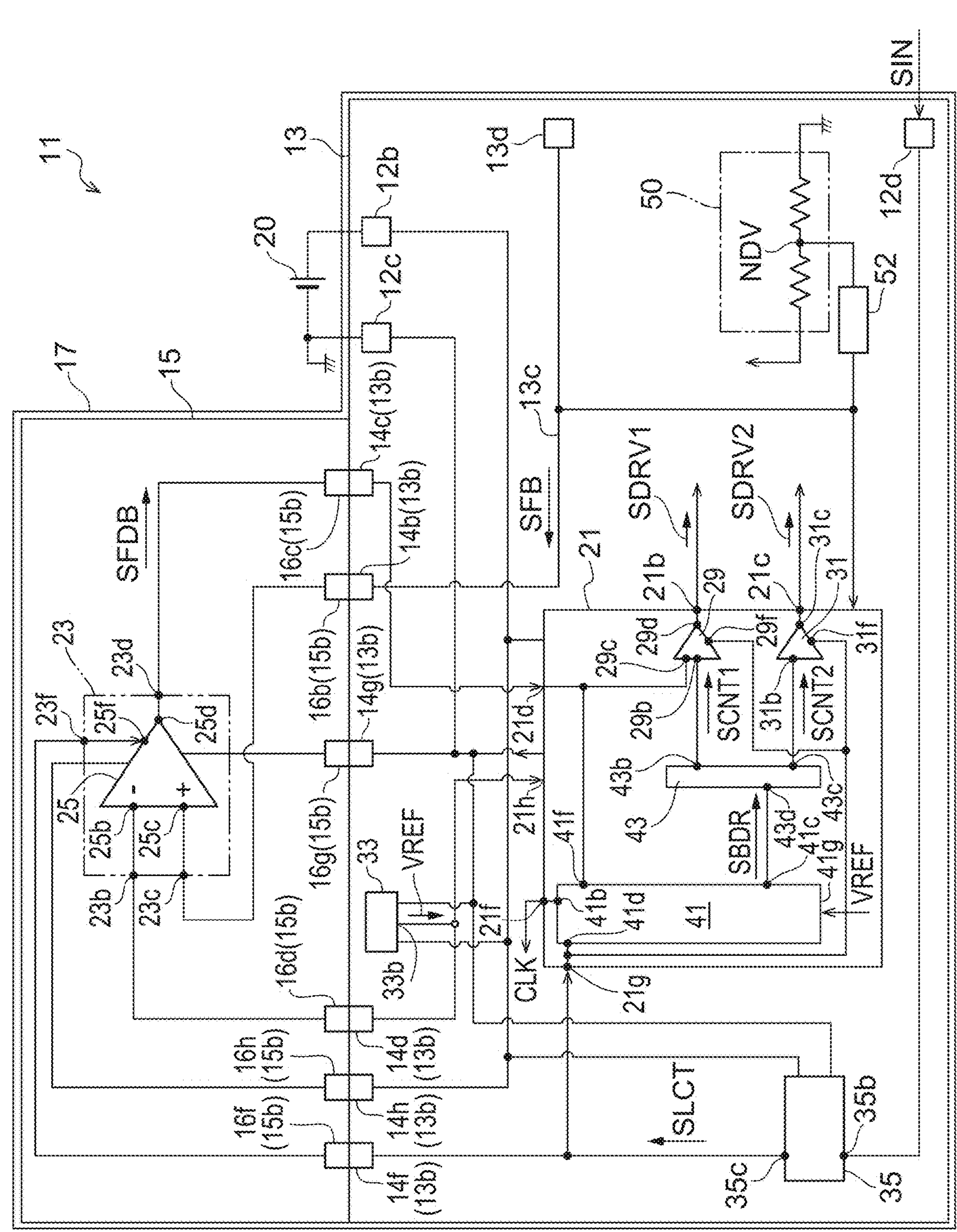
FIG. 1 is a schematic view showing a multi-die module according to the present disclosure.

Hereinafter, embodiments for carrying out the present disclosure will be described with reference to the drawings. In the following description, the same parts are denoted by the same reference numerals, and redundant description will be omitted.

FIG. 1 is a schematic drawing showing a multi-die module according to the present disclosure. The multi-die module 11 includes a first semiconductor die 13, a second semiconductor die 15, and a package 17.

The first semiconductor die 13 includes a first control circuit 21 configured to control at least one DC-DC converter, and also includes multiple internal electrodes **13*b*, an internal line 13*c*, and multiple external electrodes, such as an external electrode 13*d*. The external electrodes are configured to enable electrical connection between the multi-die module 11** and an external circuit, and may include, for example, a pad electrode.

The second semiconductor die 15 includes a second control circuit 23 configured to control at least one linear regulator, and has multiple internal electrodes **15*b*. The package 17 supports the first and second semiconductor dies 13 and 15 such that at least the first and second semiconductor dies 13 and 15 constitute the multi-die module 11**.

The multi-die module 11 can include the following external electrodes, specifically, a first power supply electrode **12*b* and a second power supply electrode 12*c*, which. The first and second power electrodes 12*b* and 12*c* are configured to feed electrical power to the multi-die module 11, and may be connected to an external power source 20. In the multi-die module 11, the multiple electrodes can include a mode selection electrode 12*d*, which is configured to receive a selection signal indicating which of a DC-DC converter or a linear regulator the multi-die module 11 should control, as will be described in the following. However, this selection signal may be supplied from a certain circuit within the multi-die module 11. In the exemplary multi-die module 11, the above-described external electrode can be disposed on either the first and second semiconductor die 13 or 15. The external electrodes may be provided on not the second semiconductor die 15 but the first semiconductor die 13. Alternatively, the external electrodes can be disposed on the first and second semiconductor dies 13 and 15**.

In the multi-die module 11, the first semiconductor die 13 can be provided with the internal electrodes **13*b* connected to the internal electrodes 15*b* of the second semiconductor die 15. The exemplary second semiconductor die 15 may not be provided with an external electrode, such as the external electrode 13***d*. Providing one of the first and second semiconductor dies 13 and 15 with an external electrode may divide the assembly process into two parts, specifically, one of which fabricates one or more interconnects between the first and second semiconductor dies 13 and 15 and the other of which fabricates one or more interconnects between the first semiconductor die 13 and the package 17. However, the present embodiment is not limited thereto, and the second semiconductor die 15 may be disposed with the one or more an external electrodes.

The first control circuit 21 has one or more outputs, specifically a first output 21*b* and a second output 21*c*, and one or more inputs, specifically a reference input 21*h*. The first control circuit 21 may be provided with at least a part of the outputs, which may be connected to an external driving circuit and/or an external electrode embedded in the first semiconductor die 13.

The second control circuit 23 can have a reference input 23*b*, a feedback input 23*c*, and a comparison output 23*d*. The second control circuit 23 compares the reference voltage, which is received at the reference input 23*b*, with the feedback signal, which is received at the feedback input 23*c* to generate a difference signal therebetween at the comparison output 23*d*. An exemplary second control circuit 23 may include at least one voltage comparison circuit 25. The voltage comparison circuit 25 has a reference input 25*b*, a feedback input 25*c*, and a comparison output 25*d*, and may include, for example, a differential amplifier circuit.

In the first semiconductor die 13, the internal electrodes 13*b* includes a first internal electrode 14*b*, and in the second semiconductor die 15, the internal electrodes 15*b* includes a first internal electrode 16*b*. The first and second semiconductor dies 13 and 15 are connected to each other through an interconnect between the first internal electrodes 14*b* and 16*b*, such that the first and second semiconductor dies 13 and 15 form the multi-die module 11. In the exemplary first semiconductor die 13, the first internal electrode 14*b* is connected to the external electrode 13*d* via the internal line 13*c*.

The exemplary first semiconductor die 13 is provided with the external electrode 13*d*, and the exemplary second semiconductor die 15 is provided with no external electrode. The circuits of the second semiconductor die 15 are connected to those of the first semiconductor die 13 via the internal electrodes 13*b* and 15*b*, and/or to any external electrode including the external electrode 13*d*.

The feedback input 25*c* of the voltage comparison circuit 25 may be connected to the first internal electrode 16*b* of the second semiconductor die 15. In the exemplary second control circuit 23, the voltage comparison circuit 25 may include a circuit (working mainly as an analog circuit) configured to operate as an error amplification circuit of the regulator circuit. The voltage comparison circuit 25 may be connected to the external electrode 13*d* to receive, at a feedback input 25*c* via the external electrode 13*d*, a feedback signal SFB to control the regulator circuit. The exemplary first control circuit 21 can include, for example, a circuit (working as a digital circuit) required to control the DC-DC converter circuit, and a circuit (working as an analog circuit) required to control the DC-DC converter circuit.

In the exemplary second control circuit 23, the voltage comparison circuit 25 may include a circuit (working mainly as an analog circuit) configured to operate as an error amplification circuit of a linear regulator circuit and/or a DC-DC converter circuit. The exemplary second control circuit 23 can determine one of, for example, the linear regulator circuit and the DC-DC converter circuit in response to a switching signal. The exemplary voltage comparator circuit 25 is connected to the external electrode 13*d* at the feedback input 25*c* to receive the feedback signal SFB, which can control a linear regulator circuit or a DC-DC converter circuit, at the feedback input 25*c* via the external electrode 13*d*. The exemplary first control circuit 21 can include, for example, a circuit (working mainly as a digital circuit) required for controlling a DC-DC converter circuit.

Accordingly, the multi-die module 11 includes multiple regulators or partial circuits of the multiple regulators. One of the regulators includes a DC-DC converter circuit and the other includes a linear regulator circuit. The multi-die module 11, which is provided with the multiple regulators, can satisfy user requirements. Further, the multiple regulator control circuits, specifically a DC-DC converter control circuit and a linear regulator control circuit, are mounted on the first and second semiconductor dies 13 and 15.

The exemplary multi-die module 11 is configured to form a part of a DC-DC converter and a part of a linear regulator, and is configured to control the DC-DC converter and the linear regulator. Specifically, the linear regulator and the DC-DC converter can operate in different manners in response to the voltage generated at the external electrode 13*d*. Specifically, the linear regulator allows the voltage comparator circuit 25 to operate in response to voltage changes caused by the change in the load current consumption, and the DC-DC converter allows the voltage comparator circuit 25 to operate in response to voltage changes caused by the current consumption of the load and the induction of the inductor connected to the external electrode 13*d*.

In controlling the linear regulator, the voltage comparison circuit 25 compares the feedback signal SFB from the external electrode 13*d* and the reference voltage VREF from the reference voltage generation circuit 33 with each other to generate a feedback control signal SFDB indicating the difference between these voltages. Using this feedback control signal SFDB allows the voltage comparison circuit 25 to control the output transistor of the linear regulator.

In controlling the DC-DC converter, the voltage comparison circuit 25 operates to compare the feedback signal SFB from the external electrode 13*d* with the reference voltage VREF (which may be determined to be different from the reference voltage to control the linear regulator) of the reference voltage generation circuit 33 to generate the feedback control signal SFDB, which indicates the difference between these voltages. The voltage comparison circuit 25 controls the first control circuit 21.

Specifically, in the voltage comparison circuit 25 configured to control each of the DC-DC converter and the linear regulator, the feedback control signal SFDB that controls the DC-DC converter is supplied to the first control circuit 21, while the feedback control signal SFDB that controls the linear regulator is supplied to, via the first control circuit 21, the external driving circuit and/or external electrode built in the first semiconductor die 13.

The first and second control circuits 21 and 23 are connected to each other so as to enable transmission of, for example, the feedback control signal SFDB and/or the feedback signal SFB between the first and second control circuits 21 and 23.

In the exemplary multi-die module 11, the first control circuit 21 is configured to control the DC-DC converter circuit, and may primarily include digital circuits to control the DC-DC converter. The voltage comparison circuit 25 of the second control circuit 23 is configured for the feedback control in the regulator circuit. The voltage comparison circuit 25 may primarily include an analog circuit configured to control the linear regulator circuit, and can also primarily include an analog circuit configured to control a DC-DC converter circuit.

Each of the first and second semiconductor dies 13 and 15 has a smaller area than a single die of the semiconductor integrated circuit that includes both the first and second control circuits 21 and 23.

Testing the first semiconductor die 13 includes testing the characteristics and function of the first control circuit 21 and does not include testing the characteristics and function of the second control circuit 23. This test has a period of a testing time shorter than that required for the semiconductor integrated circuit of the single die.

The test of characteristics of the second semiconductor die 15 includes testing the characteristics and function of the second control circuit 23, and does not include testing the characteristics and function of the first control circuit 21. This test has a period of a testing time shorter than that required for the semiconductor integrated circuit of the single die.

The test of characteristics of the multi-die module 11 may include testing the interconnection between the first and second semiconductor dies 13 and 15, as well as testing the function of the DC-DC converter circuit and the linear regulator circuit. Except for the classification of failure modes, the function test of the DC-DC converter circuit and/or the linear regulator circuit can also serve as a testing the interconnection between the first and second semiconductor dies 13 and 15.

The function tests of the first and second control circuits 21 and 23 have already been completed prior to fabricating the multi-die module 11. In addition, before the multi-die module 11 is fabricated, the first and second semiconductor dies 13 and 15 that have failed the respective tests, such as the individual characteristics, are already removed from the parts that is to be used for fabricating the multi-die module 11.

In the exemplary multi-die module 11, the internal electrodes 15*b* of the second semiconductor die 15 may include a second internal electrode 16*c* connected to the comparison output 25*d* of the voltage comparison circuit 25. The internal electrodes 13*b* of the first semiconductor die 13 may include a second internal electrode 14*c* connected to the second internal electrode 16*c* of the second semiconductor die 15. The second internal electrode 14*c* is connected via one or more circuits, such as the first control circuit 21, and/or directly to the external electrode.

Next, a description will be given of the multi-die module 11.

The exemplary multi-die module 11 can further include a reference voltage generation circuit 33, which is disposed on either the first or second semiconductor die 13 or 15. The reference voltage generation circuit 33 can generate, at the output 33*b* (VREF) thereof, respective reference voltages, which are supplied to the reference input 21*h* of the first control circuit 21 and the reference input 25*b* (23*b*) of the voltage comparison circuit 25, respectively.

In the first semiconductor die 13, the internal electrodes 13*b* may include a third internal electrode 14*d*, and in the second semiconductor die 15, the internal electrodes 15*b* may include a third internal electrode 16*d*. The first and second semiconductor dies 13 and 15 are connected to each other at the third internal electrodes 14*d* and 16*d*.

Regarding the first semiconductor dies 13 and 15, the third internal electrodes 14*d* and 16*d* can be connected to the output 33*b* (VREF) of the reference voltage generation circuit 33. The third internal electrode 14*d* may be connected to the reference input 21*h* of the first control circuit 21 or the output 33*b* (VREF) of the reference voltage generation circuit 33. The third internal electrode 16*d* can be connected to the reference input 23*b* of the second control circuit 23 (the reference input 25*b* of the voltage comparison circuit 25) or the output 33*b* (VREF) of the reference voltage generation circuit 33.

The reference voltage generation circuit 33 can be disposed in the first semiconductor die 13, as shown in FIG. 1. Alternatively, the reference voltage generation circuit 33 may be disposed in the second semiconductor die 15.

The exemplary multi-die module 11 further includes a selection signal generation circuit 35 disposed on either the first or second semiconductor die 13 or 15, and the selection signal generation circuit 35 receives a signal at the input 35*b*. In response to the input signal SIN, the selection signal generation circuit 35 generates a selection signal SLCT to cause the DC-DC converter and the linear regulator to operate exclusively. The selection signal SLCT has a first value and a second value indicating which of the DC-DC converter and the linear regulator should operate. The selection signal SLCT may be supplied to the first and second control circuits 21 and 23 from the output 35*c* of the selection signal generation circuit 35. The first control circuit 21 receives the selection signal SLCT at a switching input 21*g*, and the switching input 23*f* (25*f*) of the second control circuit 23 (the voltage comparison circuit 25).

In the first semiconductor die 13, the internal electrodes 13*b* may include a fourth internal electrode 14*f*, and in the second semiconductor die 15, the internal electrodes 15*b* may include a fourth internal electrode 16*f*. In the first and second semiconductor dies 13 and 15, the fourth internal electrode 14*f* is connected to the fourth internal electrode 16*f*.

In the first and second semiconductor dies 13 and 15, at least one of the fourth internal electrodes 14*f* and 16*f* is connected to the selection signal generation circuit 35. The first control circuit 21 is connected to the fourth internal electrode 14*f* or the selection signal generation circuit 35. The second control circuit 23 is connected to the fourth internal electrode 16*f* or the selection signal generation circuit 35.

In the exemplary multi-die module 11, the selection signal generation circuit 35 is disposed on the first semiconductor die 13, as shown in FIG. 1. Alternatively, the selection signal generation circuit 35 may be disposed in the second semiconductor die 15.

The first control circuit 21 is connected to the selection signal generation circuit 35 to switch, in response to the selection signal SLCT from the selection signal generation circuit 35, the operation to either the DC-DC converter or the linear regulator. Further, the second control circuit 23 is connected to the selection signal generation circuit 35 to switch, in response to the selection signal SLCT from the selection signal generation circuit 35, the operations to either the DC-DC converter or the linear regulator.

In the exemplary multi-die module 11, the second semiconductor die 15 can be fed by the first semiconductor die 13. For this power supply, further internal electrodes are provided on the first and second semiconductor dies 13 and 15.

In the first and second semiconductor dies 13 can 15, specifically, the internal electrodes 13*b* may include a fifth internal electrode 14*g*, and the internal electrodes 15*b* may include a fifth internal electrode 16*g*. The fifth internal electrode 14*g* is connected to the fifth internal electrode 16*g*. This connection allows the power lines of the first and second semiconductor dies 13 and 15 to be connected to each other. Further, the internal electrodes 13*b* may include a sixth internal electrode 14*h*, and the internal electrodes 15*b* may include a sixth internal electrode 16*h*. The sixth internal electrode 14*h* is connected to the sixth internal electrode 16*h*. This connection allows the power lines of the first and second semiconductor dies 13 and 15 to be connected to each other.

In the exemplary multi-die module 11, the first control circuit 21 provides a first driving signal SDRV1 that controls the driving operations of the DC-DC converter and the linear regulator, and a second driving signal SDRV2 that controls the driving operation of the DC-DC converter. In controlling the DC-DC converter, the first control circuit 21 receives the feedback control signal SFDB at the feedback input 21*d*, and receives the clock signal CLK at the clock input 21*f*. In the first control circuit 21, the first and second driving signals SDRV1 and SDRV2 are generated to control the driving operation of the DC-DC converter based on the feedback control signal SFDB and the clock signal CLK. The first control circuit 21 provides the first driving signal SDRV1 to the first output 21*b*. Further, the first control circuit 21 provides the second driving signal SDRV2 to the second output 21*c*. The first and second control circuits 21 and 23 is determined to operate by the selection signal SLCT, which is received at the switching input 21*g*.

The exemplary first control circuit 21 may include a generation circuit 41, which generates a basic driving signal SBDR that allows the DC-DC converter to operate in response to the feedback control signal SFDB. The exemplary generation circuit 41 has a clock input 41*b*, an output 41*c*, a switching input 41*d*, an error input 41*f*, and a reference input 41*g*. The generation circuit 41 receives the clock signal CLK at the clock input 41*b*. The basic driving signal SBDR is produced from clock signal CLK and provided at the output 41*c*.

Specifically, the generation circuit 41 can adjust the duty of the basic driving signal SBDR, which is based on the clock signal CLK in response to, for example, the feedback control signal SFDB received at the error input 41*f*. The enabling operation of the generation circuit 41 is determined by the selection signal SLCT, which is received at the switching input 41*d* (21*g*). Specifically, the generation circuit 41 can be stopped during the operation of the linear regulator in response to the selection signal SLCT that selects the linear regulator.

The voltage comparison circuit 25 and the generation circuit 41 can be configured to provide various control modes, such as a voltage control mode, a current control mode, and a ripple control mode, for controlling the DC-DC converter.

The first control circuit 21 may include an adjustment circuit 43, which has an input 43*d* at which the basic driving signal SBDR is received. The adjustment circuit 43 generates a first control signal SCNT1 and a second control signal SCNT2 that control the driving operation of the DC-DC converter based on the basic driving signal SBDR, which is received at the input 43*d*. The adjustment circuit 43 supplies the first and second control signals SCNT1 and SCNT2 at a first output 43*b* and a second output 43*c*, respectively. The exemplary adjustment circuit 43 adjusts the waveforms of the first and second control signals SCNT1 and SCNT2 such that no through current flows through the driving transistors of the DC-DC converter.

The first control circuit 21 can include a first driving circuit 29 and a second driving circuit 31. Each of the first and second driving circuits 29 and 31 operates in response to the selection signal SLCT, which is received at the inputs 29*f* and 31*f*.

The exemplary first driving circuit 29 has a first input 29*b*, a second input 29*c*, an output 29*d*, and a switching input 29*f*. The first input 29*b* is connected to the first output 43*b* of the adjustment circuit 43. The second input 29*c* is connected to the second internal electrode 14*c* of the first semiconductor die 13 to receive the feedback control signal SFDB from the voltage comparison circuit 25. The first driving signal SDRV1 is provided at the output 29*d*. The second driving circuit 31 also has an input 31*b*, an output 31*c*, and a switching input 31*f*. The input 31*b* is connected to the output 41*c* of the generation circuit 41, and the output 31*c* provides the second driving signal SDRV2.

When the selection signal SLCT indicates the operation of the DC-DC converter, the first and second driving circuits 29 and 31 produce the first and second driving signals SDRV1 and SDRV2 from the first and second control signals SCNT1 and SCNT2, respectively. The first and second driving signals SDRV1 and SDRV2 are configured to control the drive of the DC-DC converter.

Figure 2:
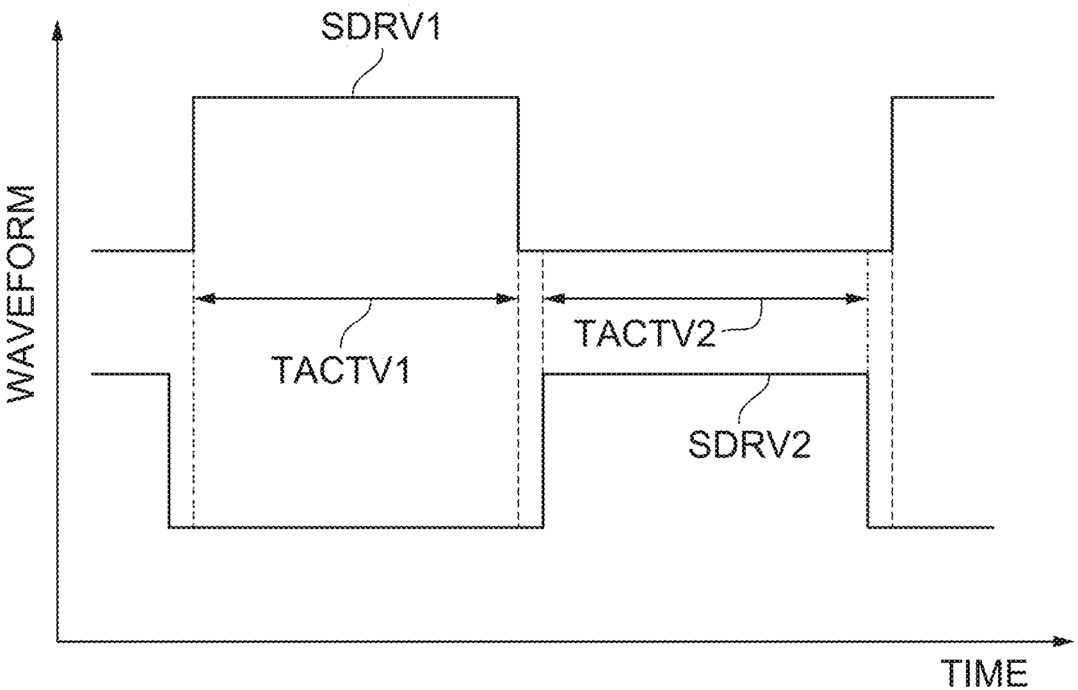
FIG. 2 is a view illustrating exemplary waveforms of a first driving signal and a second driving signal.

In the operation of the DC-DC converter, as shown in FIG. 2, the first and second driving signals SDRV1 and SDRV2 activate the first and second control circuits 21 and 23, respectively. The first and second driving signals SDRV1 and SDRV2 are provided with respective first and second activation periods TACTV1 and TACTV2. The first activation period TACTV1 does not overlap the second activation period TACTV2 on time line. The adjustment circuit 43 controls the first and second control signals SCNT1 and SCNT2 to avoid this overlap.

Referring again to FIG. 1, the first driving circuit 29 chooses, in response to the selection signal SLCT received at the switching input 29*f*, one of the signals to control the DC-DC converter and the linear regulator to provide the signal thus chosen as the first driving signal SDRV1. Specifically, when the selection signal SLCT indicates that the linear regulator is selected, the first driving circuit 29 provides, as the first driving signal SDRV1, the feedback control signal SFDB, which is provided from the comparison output 25*d* of the voltage comparison circuit 25. As already described, when the selection signal SLCT indicates that the DC-DC converter circuit is selected, the first driving circuit 29 generates the first driving signal SDRV1, which is generated from the first control signal SCNT1, as a signal for controlling the DC-DC converter.

When the selection signal SLCT indicates that the linear regulator is selected, the second driving circuit 31 is not used, so that the second driving circuit 31 can be configured to stop its operation in response to the selection signal SLCT.

The first semiconductor die 13 can further include a voltage divider circuit 50 and a switch circuit 52. The voltage dividing circuit 50 can be connected between the external electrode 13*d* and any one of power supply line. The voltage dividing node NDV of the exemplary voltage dividing circuit 50 may be connected to the first control circuit 21 and/or the internal line 13*c* via the switch circuit 52. Further, the voltage dividing node NDV of the voltage dividing circuit 50 may be connected to the second control circuit 23 via the internal electrodes (13*b* and 15*b*). The voltage comparator circuit 25 operates in response to the power supply voltage of the external power supply 20, and the regulator voltage, which is supplied by the multi-die module according to the present disclosure, is lower than the power supply voltage of the external power supply 20. Accordingly, the voltage divider circuit 50 can be used when required. Specifically, the voltage divider circuit 50 is configured to generate the feedback signal SFB in the first semiconductor die 13 in response to the output voltage of the regulator.

With reference to FIGS. 3, 4, 5, 6, and 7, exemplary multi-die modules according to the present disclosure will be described below.

Figure 3:
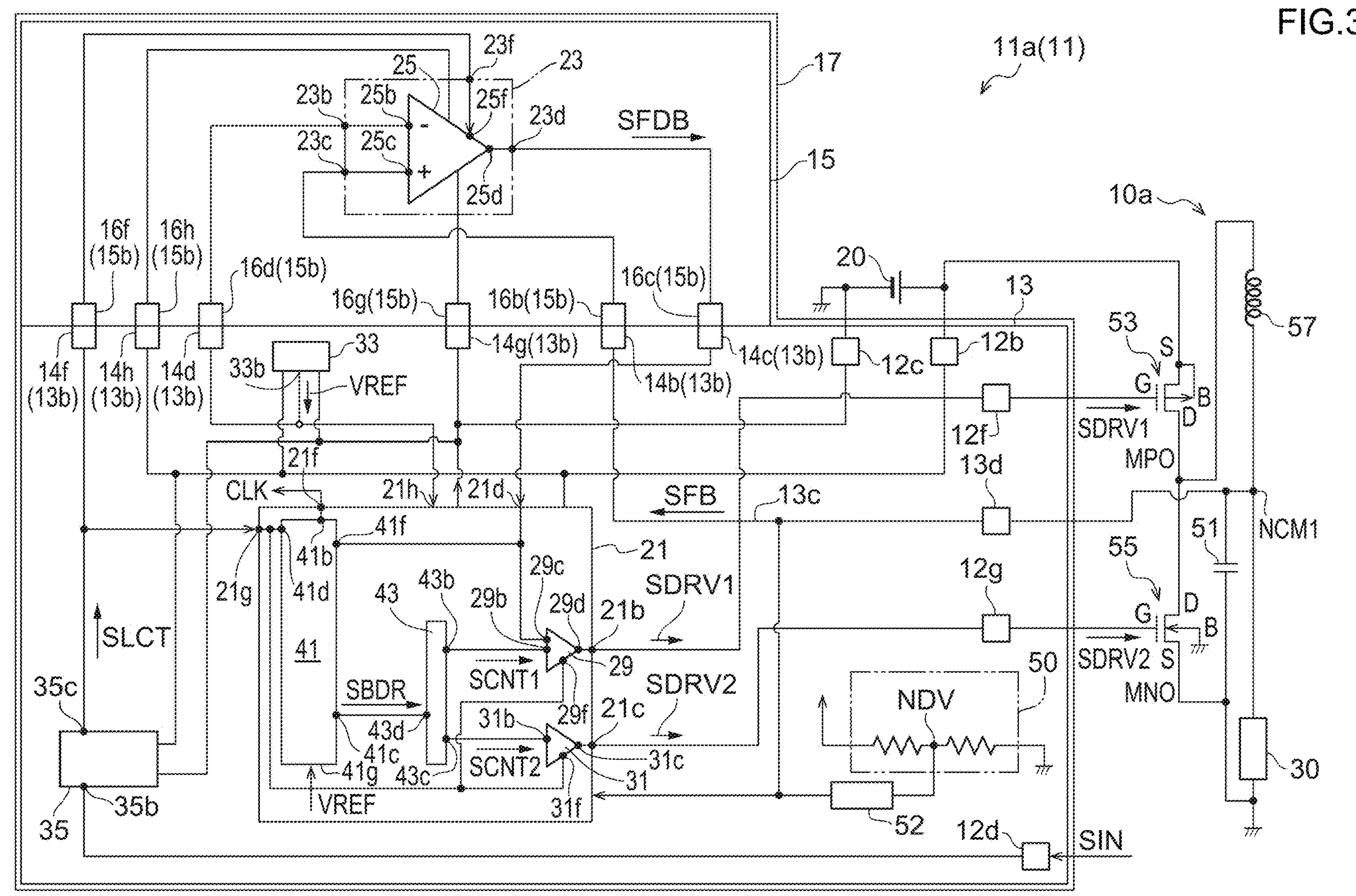
FIG. 3 is a schematic view illustrating a power supply including an exemplary multi-die module according to the present disclosure.
Figure 4:
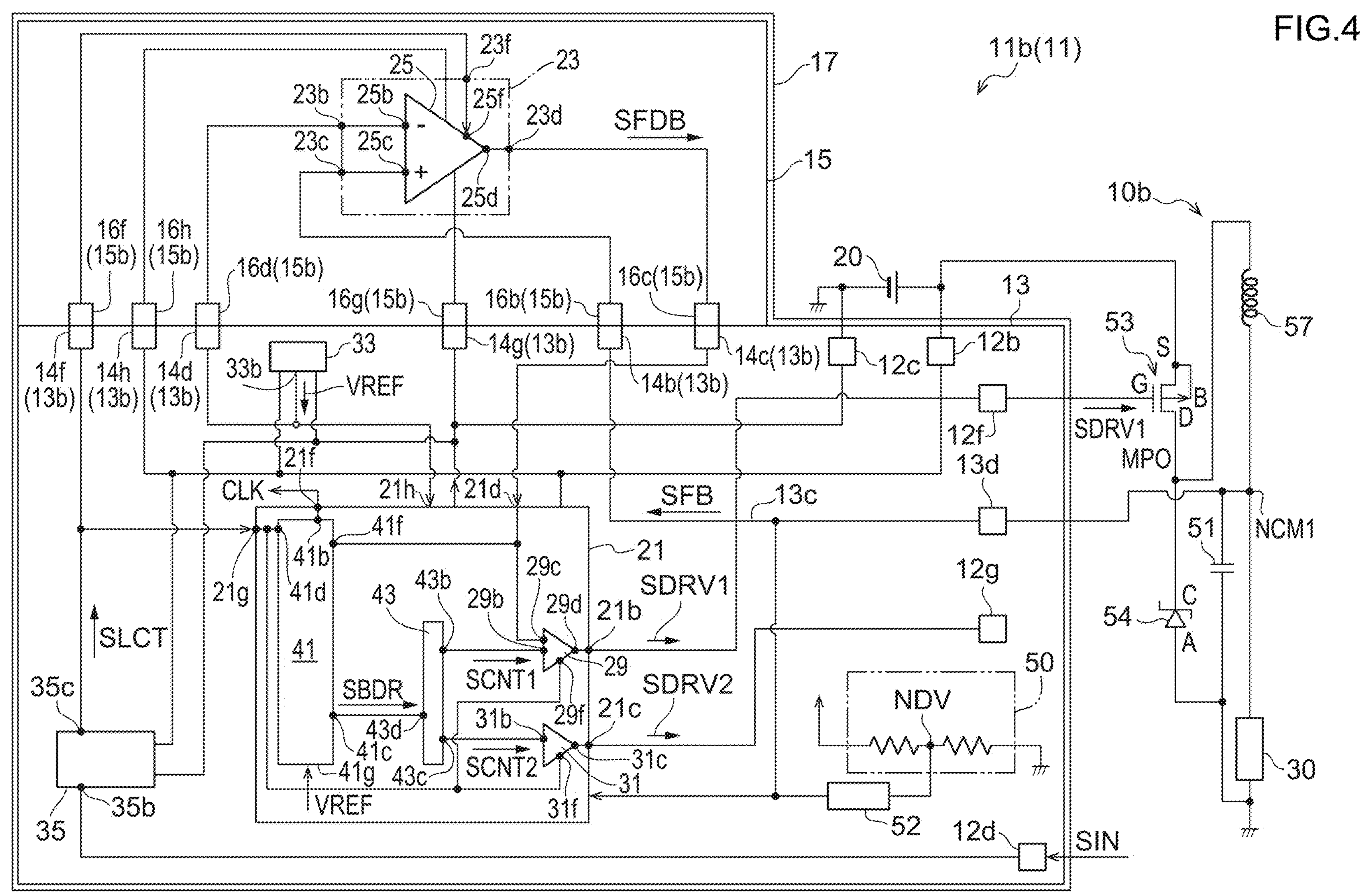
FIG. 4 is a schematic view illustrating a power supply including an exemplary multi-die module according to the present disclosure.
Figure 5:
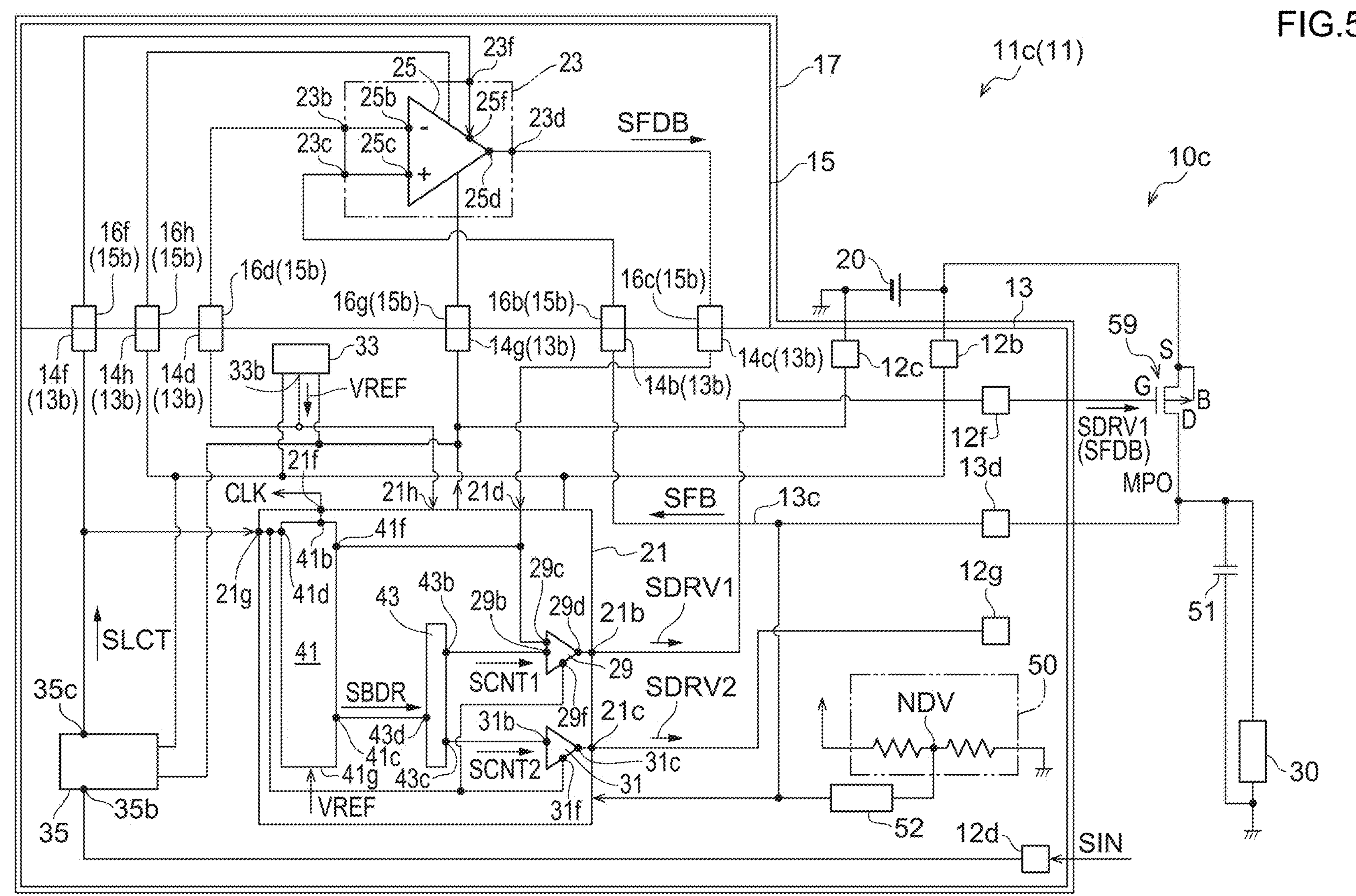
FIG. 5 is a schematic view illustrating a power supply including an exemplary multi-die module according to the present disclosure.

FIG. 3 is a schematic view illustrating a power supply device including an exemplary multi-die module according to the present disclosure. The power supply device 10*a* and multi-die module 11*a* (11) in FIG. 3 are configured to form a step-down DC-DC converter. FIG. 4 is a schematic view illustrating a power supply including an exemplary multi-die module according to the present disclosure. The power supply device 10*b* and multi-die module 11*b* (11) in FIG. 4 are configured to form a step-down DC-DC converter. FIG. 5 is a schematic view illustrating a power supply including an exemplary multi-die module according to the present disclosure. The power supply 10*c* and multi-die module 11*c* (11) of FIG. 5 are configured to form a linear regulator. In the following description, reference numerals used in FIG. 1 will be used, where possible, to omit duplicable description.

Referring to FIG. 3, the power supply device 10*a* is shown. The power supply 10*a* uses a multi-die module 11*a*. The multi-die module 11*a* may be provided with a fifth external electrode 12*f* and a sixth external electrode 12*g*. The output 29*d* of the first driving circuit 29 is connected to the fifth external electrode 12*f*, and the output 31*d* of the second driving circuit 31 is connected to the sixth external electrode 12*g*. The mode selection electrode 12*d* receives the selection signal SLCT that allows the control action as a DC-DC converter to be applied to the multi-die module 11*a* (11).

The power supply device 10*a* includes multiple a capacitor 51, external active elements, such as a first external transistor 53 and a second external transistor 55, and an inductor 57 in addition to the multi-die module 11*a*. In FIG. 3, the first and second external transistors 53 and 55 are depicted by a field effect transistor circuit symbol.

One of the external elements may include, for example, a p-type transistor MP0 as the first external transistor 53, but is not limited to this conductivity type. The source(S) and back gate (B) of the p-type transistor MP0 can be connected to the external power supply 20 via a higher potential power supply line.

Another of the external elements may include, for example, an n-type transistor MN0 as a second external transistor 55, but is not limited to a transistor. The second external transistor 55 can include, for example, an n-type transistor MN0, and the source(S) and back gate (B) of the n-type transistor MN0 are connected to the external power supply 20 via a lower potential power supply line.

The inductor 57 has one end of the inductor 57 connected to the drain (D) of the first external transistor 53 and the drain (D) of the second external transistor 55. The inductor 57 has another end connected to one end of the capacitor 51 and the external electrode 13*d*, and the other end of the capacitor 51 is connected to the lower potential power line (for example, a ground line). The node NCM1, which is shared by the inductor 57 and capacitor 51, is connected to the load 30. Further, the shared node NCM1 is connected to the external electrode 13*d*, which receives the feedback signal SFB from the shared node NCM1.

The first driving circuit 29 receives the basic driving signal SBDR from the generation circuit 41 to generate the first driving signal SDRV1, which is configured to control the DC-DC converter. The first external transistor 53 receives, at its gate (G), the first driving signal SDRV1 from the first driving circuit 29 via the external electrode 12*f* to be controlled by the first driving circuit 29.

The second driving circuit 31 receives the basic driving signal SBDR from the generation circuit 41 to generate the second driving signal SDRV2, which is configured to control the DC-DC converter. The second external transistor 55 receives, at its gate (G), the second driving signal SDRV2 from the second driving circuit 31 via the external electrode 12*g* to be controlled by the second driving circuit 31.

Referring to FIG. 4, the power supply device 10*b* is shown. In the step-down DC-DC converter, the power supply device 10*b* may include, as shown in FIG. 4, a diode 54 in place of the second external transistor 55 in FIG. 3. The diode 54 is provided with the cathode (C) connected to the drain (D) of the first external transistor 53, and is also provided with the anode (A) connected to the power supply line. In the power supply device 10*b*, the second driving circuit 31 is not used.

Referring to FIG. 5, the power supply device 10*c* is shown. The power supply 10*c* uses a multi-die module 11*c*. The multi-die module 11*c* may be provided with the fifth external electrode 12*f*. The first driving circuit 29 has an output 29*d* connected to the fifth external electrode 12*f*. The mode selection electrode 12*d* receives a selection signal SLCT that allows the control action as a linear regulator to be applied to the multi-die module 11*b* (11).

FIG. 5 depicts the first control circuit 21, the adjustment circuit 43, the sixth external electrode 12*g*, and the second driving circuit 31, and however, these are not used to control the linear regulator.

Specifically, the power supply device 10*c* is provided with a capacitor 51 and an external active element, for example, a third external transistor 59, in addition to the multi-die module 11*c*. The capacitor 51 has one end connected to the drain (D) of the third external transistor 59, and the capacitor 51 has another end connected to the lower potential power line (for example, a ground line). The node NCM2, which is shared by the third external transistor 59 and the capacitor 51, is connected to the load 30.

The third external transistor 59 can include, for example, a p-type transistor MP0, the source (S) and back gate (B) of which can be connected to the external power supply 20 via a power supply line. The third external transistor 59 receives, at its gate (G), the feedback control signal SFDB from the comparison output 25*d* of the voltage comparison circuit 25 via the external electrode 12*f*, and is controlled via the first driving circuit 29.

FIG. 5 depicts the third external transistor 59 as a circuit symbol of a field effect transistor, which is not limited thereto, and accordingly, the third external transistor 59 may include a bipolar transistor instead of a field effect transistor.

Figure 6:
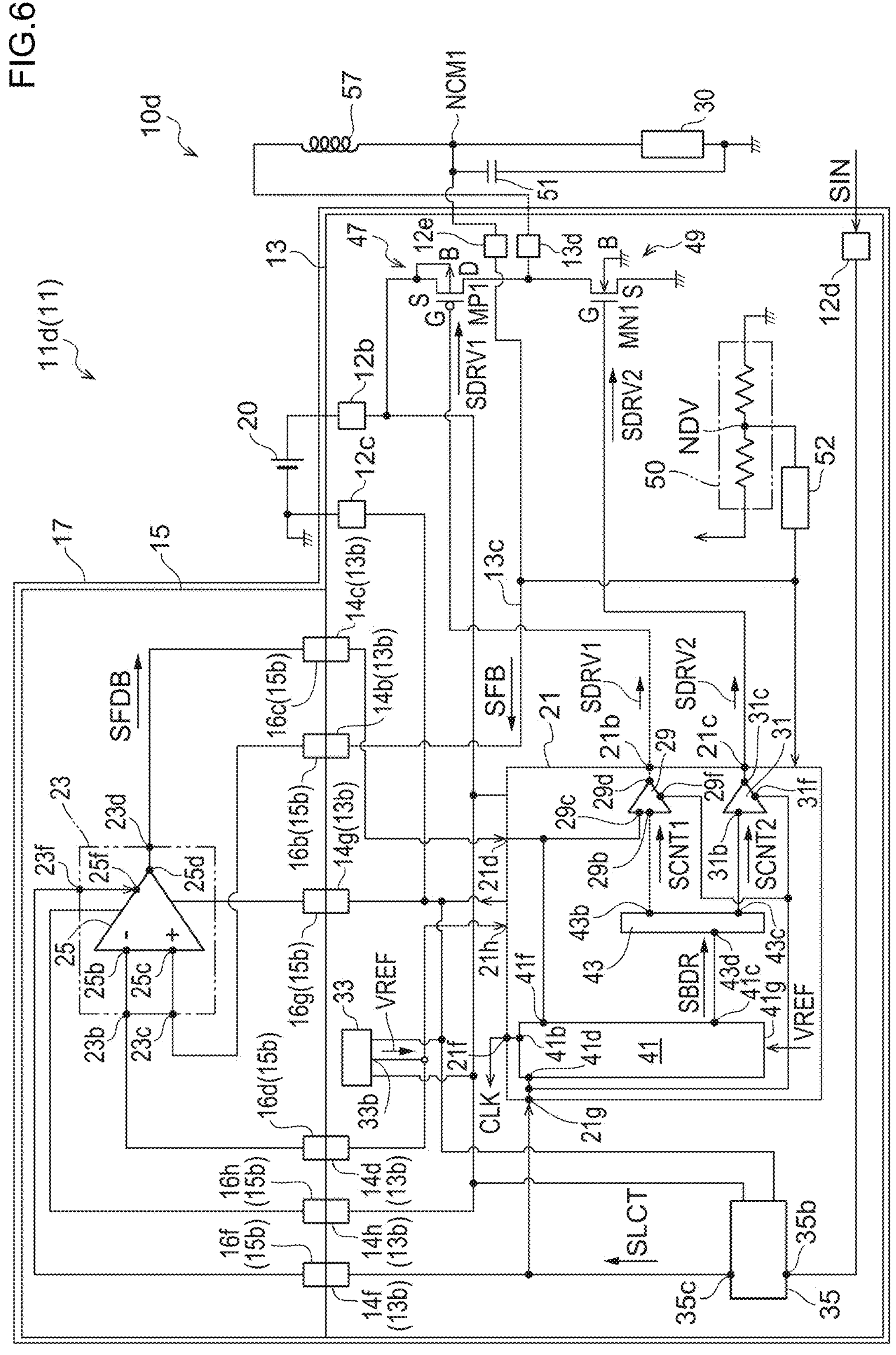
FIG. 6 is a schematic view illustrating a power supply including an exemplary multi-die module according to the present disclosure.
Figure 7:
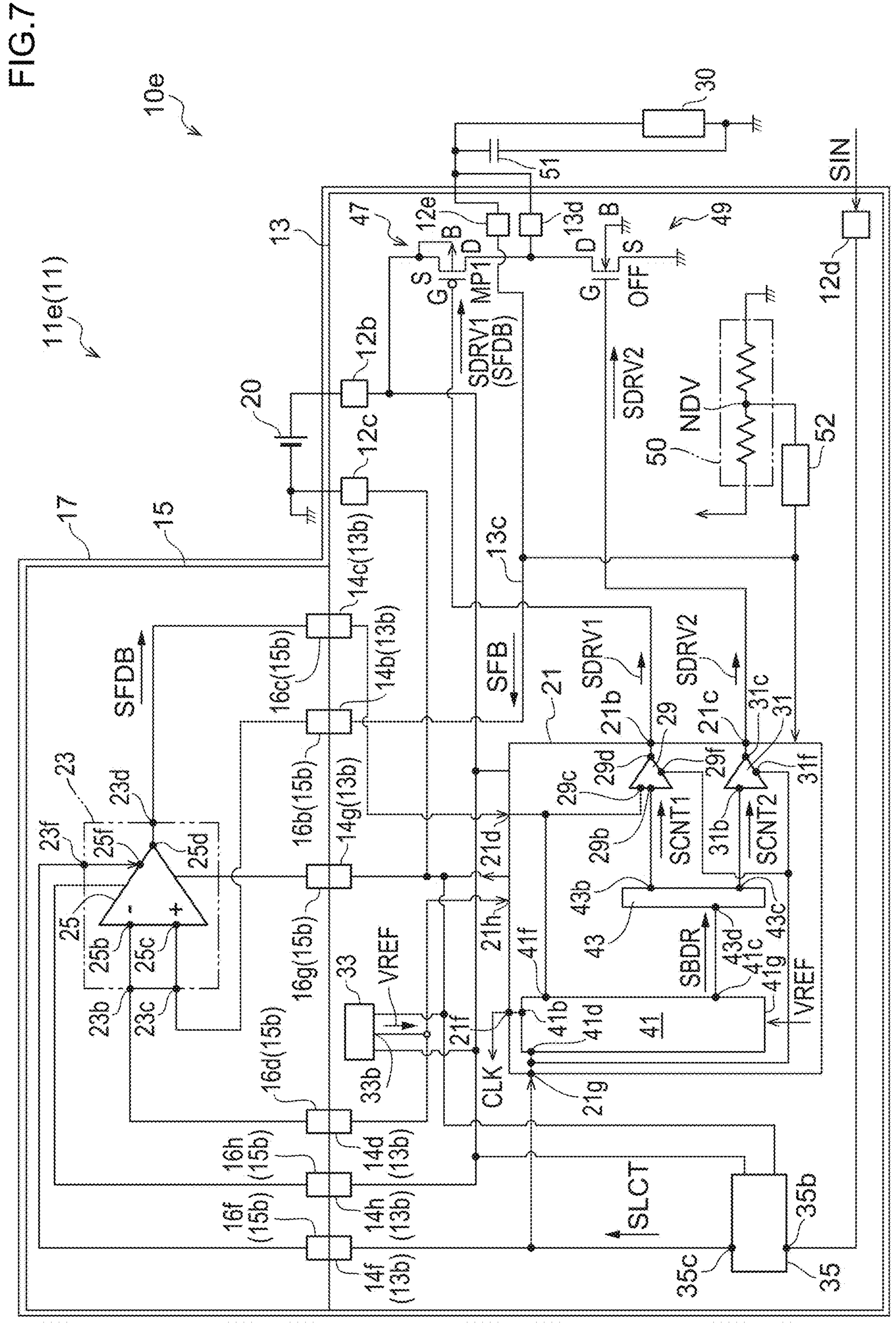
FIG. 7 is a schematic view illustrating a power supply including an exemplary multi-die module according to the present disclosure.

FIG. 6 is a schematic view illustrating a power supply device including an exemplary multi-die module according to the present disclosure. The multi-die module 11*d* (11) of FIG. 6 is configured to form a step-down DC-DC converter. FIG. 7 is a schematic view illustrating a power supply including an exemplary multi-die module according to the present disclosure. The multi-die module 11*e* (11) of FIG. 7 is configured to form a linear regulator. In the following description, reference numerals used in FIGS. 1, 3, 4 and 5 will be used, where possible, to omit duplicable description.

Referring to FIG. 6, a power supply device 10*d* is shown. The power supply device 10*d* uses a multi-die module 11*d*, which may further include a first output transistor 47 and a second output transistor 49, each of which is depicted by a field effect transistor circuit symbol. The mode selection electrode 12*d* receives a selection signal SLCT that allows the control action as a DC-DC converter to be applied to the multi-die module 11*d* (11).

The first output transistor 47 may include, for example, a p-type transistor MP1, the source (S) and back gate (B) of which are connected to the external power supply 20 via a higher potential power supply line.

The second output transistor 49 may include, for example, an n-type transistor MN1, the source (S) and back gate (B) of which are connected to the external power supply 20 via the lower potential power supply line.

The inductor 57 has one end connected to the drain (D) of the first output transistor 47 and the drain (D) of the second output transistor 49 via the external electrode 13*d*. The other end of the inductor 57 is connected to the internal line 13*c* via the external electrode 12*e*, and also to one end of the capacitor 51. The other end of the capacitor 51 is connected to a lower potential power line (e.g., a ground line). The node NCM1, which is shared by the inductor 57 and capacitor 51, is connected to the load 30. Further, the shared node NCM1 is connected to the external electrode 12*e*, which receives the feedback signal SFB from the shared node NCM1. The external electrode 13*d* is used to supply respective driving signals from the first and second output transistors 47 and 49 to the inductor 57.

The first driving circuit 29 receives the basic driving signal SBDR from the generation circuit 41 to generate the first driving signal SDRV1, which is configured to control the DC-DC converter. The first output transistor 47 receives, at its gate (G), the first driving signal SDRV1 from the first driving circuit 29, and is controlled by the first driving signal SDRV1.

The second driving circuit 31 receives the basic driving signal SBDR from the generation circuit 41 to generate a second driving signal SDRV2, which is configured to control the DC-DC converter. The second output transistor 49 receives, at its gate (G), the second driving signal SDRV2 from the second driving circuit 31, and is controlled by the second driving signal SDRV2.

Referring to FIG. 7, a power supply device 10*e* is shown. The power supply 10*e* uses a multi-die module 11*e*, which may further include a first output transistor 47. The first output transistor 47 is depicted by a field effect transistor circuit symbol. The mode selection electrode 12*d* receives a selection signal SLCT that allows the control action as a linear regulator to be applied to the multi-die module 11*e* (11).

The output 29*d* of the first driving circuit 29 is connected to the gate (G) of the first output transistor 47.

FIG. 7 depicts the second driving circuit 31, the generation circuit 41, the adjustment circuit 43, and the second output transistor 49, and however, these are not used to control the linear regulator. The second driving circuit 31 operates to make the second output transistor 49 non-conductive. To show the "non-conductive" state, the mark of "OFF" is shown in FIG. 7 near the second output transistor 49.

Specifically, the power supply device 10*e* includes a capacitor 51 in addition to the multi-die module 11*e*. The capacitor 51 has one end connected to the load 30 and the external electrodes 13*d* and 12*e*, and the other end of the capacitor 51 is connected to the lower potential power line (for example, a ground line). The external electrode 12*e* is configured to receive the feedback signal SFB, while the external electrode 13*d* may be connected to the first output transistor 47.

The multi-die module 11*e* of FIG. 7 is configured to use the same arrangement of the external electrodes as the multi-die module 11*d* of FIG. 6. However, the multi-die module 11*e* may be provided with one of the external electrodes 13*d* and 12*e*, and in the multi-die module 11*e*, the drain (D) of the first output transistor 47, the external electrode 13*d* and the internal line 13 can be connected to each other.

The first output transistor 47 can include, for example, a p-type transistor MP0, the source (S) and back gate (B) of which can be connected to the external power supply 20 via a power supply line. The first output transistor 47 receives, at its gate (G), the feedback control signal SFDB from the comparison output 25*d* of the voltage comparison circuit 25 via the first driving circuit 29, and is controlled by the first driving signal SDRV1.

The multi-die modules 11 (11*a*, 11*b*, 11*c*, 11*d*, 11*e*) and power supplies 10 (10*a*, 10*b*, 10*c*, 10*d*, 10*e*) of FIGS. 1, 3 to 7 have been described. According to the description, the multi-die modules 11 can be provided with multiple regulators, and these power supplies 10 may include respective multi-die modules 11.

The multi-die modules 11 (11*a* and 11*b* (and 11*c*)) have the same or similar hardware configuration, and in response to the selection signal SLCT from the selection signal generation circuit 35, the multi-die modules 11 (11*a* and 11*b* (and 11*c*)) 11*a* and 11*b* (and 11*c*)) are configured to be controlled as DC-DC converters or linear regulators.

Furthermore, the multi-die modules 11 (11*d* and 11*e*) each have the same or similar hardware configuration, while the multi-die modules 11 (11*d* and 11*e*) may be controlled as a DC-DC converter or a linear regulator in response to the selection signal SLCT of the selection signal generation circuit 35.

The multi-die modules 11 (11*d* and 11*e*) shown in FIGS. 6 and 7 are provided with multiple transistors connected to the external electrode 13*d*. Specifically, when the selection signal SLCT is provided with the first value (which indicates that the DC-DC converter operates), the first driving circuit 29 causes the first output transistor 47, which acts as the output transistor of the DC-DC converter, to operate based on the first control signal SCNT1. Further, when the selection signal SLCT is provided with the second value (which indicates that the linear regulator operates), the first driving circuit 29 causes the first output transistor 47 as the output transistor of the linear regulator to operate based on the feedback control signal SFDB from the comparison output 25*d*.

The multi-die modules 11 (11*a*, 11*b*, 11*c*) shown in FIGS. 3, 4, and 5 are configured to connect the output 29*d* of the first driving circuit 29 to the fifth external electrode 12*f*, and to connect the output 31*d* of the second driving circuit 31 to the sixth external electrode 12*g*.

When the selection signal SLCT is provided with the first value (which indicates that the DC-DC converter operates), the first driving circuit 29 provides the first signal SDRV1 to the fifth external electrode 12*f* to drive the first external transistor 53 of the DC-DC converter. Furthermore, when the selection signal SLCT is provided with the second value (which indicates that the linear regulator operates), the second driving circuit 31 provides the feedback control signal SFDB to the fifth external electrode 12*f* to drive the output transistor of the linear regulator.

When the selection signal SLCT is provided with the first value (which indicates that the DC-DC converter operates), the second driving circuit 31 provides the second driving signal SDRV2 to the sixth external electrode 12*g* to drive the output transistor of the DC-DC converter. Further, when the selection signal SLCT is provided with the second value (which indicates that the linear regulator operates), the second driving circuit 31 does not provide the second driving signal SDRV2 to the sixth external electrode 12*g*.

Accordingly, the selection signal SLCT of the first value causes the second driving circuit 31 to control the second external transistor 55, which acts as the output transistor of the DC-DC converter. 2, based on the second control signal SCNT2.

The multi-die modules 11 (11*a*, 11*b*, 11*c*, 11*d*, and 11*e*) shown in FIGS. 3, 4, 5, 6 and 7 each provide the second semiconductor die 15 with a voltage comparison circuit 25.

When the selection signal SLCT is provided with the first value (which indicates that the DC-DC converter operates), the voltage comparison circuit 25 can be configured to generate the feedback control signal SFDB (comparison signal), which is used to control the DC-DC converter, based on the respective signals from the feedback input 25*c* and the reference input 25*b*. The feedback control signal SFDB is provided to the first control circuit 21, and the generation circuit 41 generates the basic driving signal SBDR based on the feedback control signal SFDB. The basic driving signal SBDR is provided to the adjustment circuit 43, which generates the first and second control signals SCNT1 and SCNT2, and these control signals SCNT1 and SCNT2 are used so that the first and second driving circuits 29 and 31 generates a first and second driving signals SDRV1 and SDRV2, respectively.

When the selection signal SLCT is provided with the second value (which indicates that the linear regulator operates), the voltage comparison circuit 25 is configured to receive signals at the feedback input 25*c* and the reference input 25*b* and generate the feedback control signal SFDB, which is used to control the linear regulator, based on the respective signals therefrom. The feedback control signal SFDB is output via the first driving circuit 29.

In the multi-die modules 11 (11*a*, 11*b*, 11*c*) shown in FIGS. 3 to 5, the output 29*d* of the first driving circuit 29 is connected to the fifth external electrode 12*f*, and the output 31*d* of the second driving circuit 31 is connected to the sixth external electrode 12*g*. The first and second driving circuits 29 and 31 are connected to the selection signal generation circuit 35.

When the selection signal SLCT is provided with the first value (which indicates that the DC-DC converter operates), the first driving circuit 29 provides the first driving signal SDRV1 to the fifth external electrode 12*f* to cause the DC-DC converter to operate. When the selection signal SLCT is provided with the second value (which indicates that the linear regulator operates), the first driving circuit 29 provides the feedback control signal SFDB from the comparison output 25*d* to the fifth external electrode 12*f* to cause the linear regulator to operate.

When the selection signal SLCT is provided with the first value (which indicates that the DC-DC converter is controlled), the second driving circuit 31 provides the second driving signal SDRV2 to the sixth external electrode 12*g* to cause the DC-DC converter to operate. When the selection signal SLCT is provided with the second value (which indicates that the linear regulator operates), the second driving circuit 31 fixes the output 31*d* of the second driving circuit 31 to one of a logical value [H] or [L] or a high impedance state.

The multi-die module 11 may be provided with the first and second semiconductor dies 13 and 15, and may further include one or more additional semiconductor dies.

An exemplary selection signal generation circuit 35 is configured to select the operation of the DC-DC converter operation and linear regulator. However, the selection signal generation circuit 35 may provide an additional operation mode with the multi-die module 11. The exemplary multi-die module 11 may provide the first semiconductor die 13 with an additional external electrode, for example, in the configurations shown in FIGS. 6 and 7. The additional external electrode may be located in the first or the second form. In the first form, the additional external electrode may be connected to the first output 21*b* of the first control circuit 21 (the output 29*d* of the first driving circuit 29) with or without a switch. In the second form, the additional external electrode may be connected to the second output 21*c* of the first control circuit 21 (the output 31*c* of the second driving circuit 31) with or without a switch.

A description will be given of a method for fabricating a semiconductor device according to the present disclosure. In this method, one or more of the steps described below can be performed in any order. In the following, reference numerals already used will be used, where possible, for ease of understanding.

In the first step, a candidate first semiconductor die 13 is prepared the characteristics of which have not been tested yet, and includes a first control circuit 21 that has a function to control at least a DC-DC converter and may has a function to control a linear regulator. Further, the first semiconductor die 13 may be provided with the internal line 13*c*, the external electrode 13*d*, and the multiple internal electrodes 13*b*. Here, this preparation may include obtaining the first semiconductor die 13 and fabricating the first semiconductor die 13.

In the second step, the first semiconductor die 13 thus prepared is subjected to a characteristic test (for example, an analog circuit operation test and/or a digital circuit function test) to obtain the first semiconductor die 13 that has passed the characteristic test (hereinafter referred to as (simply referred to as the "first semiconductor die 13").

In the third step, a candidate second semiconductor die 15 is prepared the characteristics of which have not been tested yet, and includes a second control circuit 23 that has function to control at least a linear regulator and may has a function to control a DC-DC converter. Further, the second semiconductor die 15 may be provided with the multiple internal electrodes 15*b*. Here, this preparation may include obtaining the second semiconductor die 15 and fabricating the second semiconductor die 15.

In the fourth step, the second semiconductor die 15 thus prepared is subjected to a characteristic test (for example, an analog circuit operation test and a digital circuit function test) to obtain the second semiconductor die 15 that has passed the characteristic test (hereinafter simply referred to as the "second semiconductor die 15).

In the fifth step, a candidate third semiconductor die is prepared the characteristics of which have not been tested and which is different from the first and second semiconductor dies 13 and 15, and has a semiconductor integrated circuit without the second control circuit 23 and with the multiple internal electrodes. Here, this preparation may include obtaining the third semiconductor die and fabricating the third semiconductor die.

The first and second semiconductor dies 13 and 15 and the third semiconductor die can be fabricated by, for example, a wafer process of CMOS semiconductor fabrication. The wafer product fabricated by the wafer process is separated into individual semiconductor die.

In the sixth step, the first and second semiconductor dies 13 and 15 are assembled to produce a first assembly which includes at least the first and second semiconductor dies 13 and 15. The first assembly can constitute a multi-die module.

In the seventh step, the first assembly is tested.

In the eighth step, the first semiconductor die 13 and the third semiconductor die are assembled to produce a second assembly which includes at least the first semiconductor die 13 and the third semiconductor die. The second assembly can constitute a multi-die module.

In the ninth step, the second assembly is tested.

If possible, in the additional step, the first semiconductor die 13 is assembled to create a third assembly, including the first semiconductor die 13, without the second semiconductor die 15 and the third semiconductor die. The third assembly may form a single die module and be tested.

Accordingly, the present embodiment can provide the multi-die module 11 that mounts a part or all of multiple regulators, and the power supply device 10 that includes the multi-die module 11.

As understood from the above description, the present embodiment can have various embodiments as described below.

A multi-die module according to the first embodiment of the present disclosure includes: a first semiconductor die having an internal line, an external electrode, and multiple internal electrodes, and including a first control circuit configured to control at least a DC-DC converter; a second semiconductor die having multiple internal electrodes, and including a second control circuit configured to control at least a linear regulator; and a package that supports the first and second semiconductor dies such that at least the first and second semiconductor dies form a multi-die module. The first control circuit has a reference input and one or more outputs. The second control circuit includes a voltage comparison circuit having a feedback input, a reference input, and a comparison output. The multiple internal electrodes of the first semiconductor die includes a first internal electrode. The multiple internal electrodes of the second semiconductor die includes a first internal electrode. The feedback input of the voltage comparison circuit is connected to the first internal electrode of the second semiconductor die. The first internal electrode of the first semiconductor die is connected to the first internal electrode of the second semiconductor die. The internal line connects the first internal electrode of the first semiconductor die to the external electrode.

In the multi-die module of the second embodiment in accordance with the first embodiment according to the present disclosure, the multiple internal electrodes of the second semiconductor die include a second internal electrode connected to the comparison output of the voltage comparison circuit, the multiple internal electrodes of the first semiconductor die include a second internal electrode connected to the second internal electrode of the second semiconductor die, the first control circuit includes a generation circuit and a first driving circuit, the generation circuit has an output to provide a first control signal that controls the driving of the DC-DC converter, and the first driving circuit has an output to provide a first driving signal, and the first driving circuit is connected to the output of the generation circuit and the second internal electrode of the first semiconductor die.

In the multi-die module of the third embodiment in accordance with the second embodiment according to the present disclosure, the first semiconductor die includes a first output transistor having a gate connected to the first driving circuit, and the first output transistor has a drain and a source, and one of the drain and source of the first output transistor is connected to the external electrode.

In the multi-die module of the fourth embodiment in accordance with the second or third embodiment according to the present disclosure, the first semiconductor die further includes a first external electrode different from the external electrode, and the first external electrode is connected to the output of the first driving circuit.

In the multi-die module of the fifth embodiment in accordance with any one of the second to fourth embodiments according to the present disclosure, the first control circuit is connected to the output of the generation circuit and includes a second driving circuit that has an output to provide a second driving signal, and the first and second driving signals activate the first and second control circuits in a first and second activation periods thereof, respectively, and the first activation period does not overlap the second activation period on time axis.

In the multi-die module of the sixth embodiment in accordance with the fifth embodiment according to the present disclosure, the first semiconductor die includes a first output transistor having a gate connected to the first driving circuit, the first output transistor has a drain and a source, and one of the drain and source of the first output transistor is connected to the external electrode, the first semiconductor die includes a second output transistor having a gate connected to the output of the second driving circuit, and the second output transistor has a drain connected to the external electrode.

In the multi-die module of the seventh embodiment in accordance with the fifth or sixth embodiment according to the present disclosure, the first semiconductor die further includes a second external electrode different from the external electrode, and the second driving circuit has an output connected to the second external electrode.

The multi-die module of the eighth embodiment in accordance with any one of the first to seventh embodiments according to the present disclosure further includes a reference voltage generation circuit disposed on one of the first and second semiconductor dies. The reference voltage generation circuit is configured to supply respective reference voltages to the reference input of the first control circuit and the reference input of the voltage comparison circuit, the multiple internal electrodes of the first semiconductor die includes a third internal electrode, the multiple internal electrodes of the second semiconductor die includes a third internal electrode, the third internal electrode of the first semiconductor die is connected to the third internal electrode of the second semiconductor die, the third internal electrode of the first semiconductor die is connected to at least one of the reference voltage generation circuit and the reference input of the first control circuit, and the third internal electrode of the second semiconductor die is connected to at least one of the reference voltage generation circuit and the reference input of the voltage comparison circuit.

In the multi-die module of the ninth embodiment in accordance with the eighth embodiment according to the present disclosure, the reference voltage generation circuit is disposed in the first semiconductor die.

The multi-die module of the tenth embodiment in accordance with any one of the first to ninth embodiments according to the present disclosure further includes a selection signal generation circuit disposed in one of the first and second semiconductor dies. The selection signal generation circuit generates a selection signal, and the selection signal has a first value and a second value to cause the DC-DC converter and the linear regulator to operate respectively, and the selection signal is provided to the first and second control circuits.

In the multi-die module of the 11th embodiment in accordance with the tenth embodiment according to the present disclosure, the selection signal generation circuit is disposed in the first semiconductor die, the internal electrodes of the first semiconductor die includes a fourth internal electrode connected to at least one of the selection signal generation circuit and the first control circuit, the internal electrodes of the second semiconductor die includes a fourth internal electrode connected to the fourth internal electrode of the first semiconductor die, and the second control circuit is connected to the fourth internal electrode of the second semiconductor die.

A power supply device of the 12th embodiment in accordance with the present disclosure includes: a multi-die module according to any one of the 1st to 11th embodiments; and a capacitor having one end connected to the external electrode of the multi-die module.

A power supply device according to the 13th embodiment according to the present disclosure includes: a multi-die module according to any one of the 1st to 11th embodiments; an inductor having one end connected to the external electrode of the multi-die module; and a capacitor having one end connected to the external electrode of the multi-die module.

A power supply device according to the 14th embodiment according to the present disclosure includes: a multi-die module according to any one of the 1st to 11th embodiments; a first external transistor controlled by the first control circuit and having a gate, a source and a drain, wherein the gate of the first external transistor is connected to the multi-die module, one of the source and drain of the first external transistor is connected to the external electrode, and another of the source and drain is connected to a first power supply line; and a capacitor having one end connected to the external electrode of the multi-die module.

The power supply device of the 15th embodiment in accordance with the 14th embodiment according to the present disclosure may further include an inductor having one end connected to the external electrode of the multi-die module.

The power supply device of 16th embodiment in accordance with the 14th embodiment according to the present disclosure further includes a second external transistor. The second external transistor is controlled by the first control circuit and has a gate a source and a drain, the gate of the second external transistor is connected to the multi-die module, one of the source and drain of the second external transistor is connected to the external electrode, and another of the source and drain is connected to a second power line different from the first power line.

The power supply device of the 17th embodiment in accordance with the 15th embodiment according to the present disclosure further includes a diode having one end connected to the external electrode and another end connected to a second power line different from the first power line.

The power supply device of the 18th embodiment according to the present disclosure includes: a multi-die module including a first semiconductor die and a second semiconductor die; and a first external transistor having a gate, a source and a drain, the gate of the first external transistor being connected to the multi-die module, and one of the source and drain of the first external transistor being connected to a first power supply line. The first semiconductor die includes a first control circuit configured to control at least a DC-DC converter, and has an internal line, multiple internal electrodes, and an external electrode connected to another of the source and drain of the first external transistor. The multiple internal electrodes of the first semiconductor die includes a first internal electrode that the internal line connects to the external electrode. The first control circuit has a reference input. The second semiconductor die includes a second control circuit configured to control at least a linear regulator, and has multiple internal electrodes. The multiple internal electrodes of the second semiconductor die includes a first internal electrode connected to the first internal electrode of the first semiconductor die. The second control circuit includes a voltage comparison circuit having a feedback input connected to the first internal electrode of the second semiconductor die, a reference input, and a comparison output.

The power supply device of the 19th embodiment in accordance with the 18th embodiment according to the present disclosure further includes a second external transistor. The second external transistor is controlled by the first control circuit and has a gate a source and a drain, the gate of the second external transistor is connected to the multi-die module, one of the source and drain of the second external transistor is connected to the external electrode, and another of the source and drain is connected to a second power line different from the first power line.

The power supply device of the 20th embodiment in accordance with the 19th or 18th embodiment according to the present disclosure further includes an external capacitor having one end connected to the external electrode of external electrode.

The present disclosure is not limited to the embodiments described above, and can be implemented with various changes without departing from the spirit of the present disclosure. All of these are included in the technical idea of the present disclosure.

What is claimed is:

1. A multi-die module including:

a first semiconductor die having an internal line, an external electrode, and multiple internal electrodes, and including a first control circuit configured to control at least a DC-DC converter;

a second semiconductor die having multiple internal electrodes, and including a second control circuit configured to control at least a linear regulator; and a package that supports the first and second semiconductor dies such that at least the first and second semiconductor dies form a multi-die module, wherein the first control circuit has a reference input and one or more outputs, wherein the second control circuit includes a voltage comparison circuit having a feedback input, a reference input, and a comparison output, wherein the multiple internal electrodes of the first semiconductor die includes a first internal electrode, wherein the multiple internal electrodes of the second semiconductor die includes a first internal electrode, wherein the feedback input of the voltage comparison circuit is connected to the first internal electrode of the second semiconductor die, wherein the first internal electrode of the first semiconductor die is connected to the first internal electrode of the second semiconductor die, and wherein the internal line connects the first internal electrode of the first semiconductor die to the external electrode.

2. The multi-die module according to claim 1, wherein the multiple internal electrodes of the second semiconductor die include a second internal electrode connected to the comparison output of the voltage comparison circuit, wherein the multiple internal electrodes of the first semiconductor die include a second internal electrode connected to the second internal electrode of the second semiconductor die, wherein the first control circuit includes a generation circuit and a first driving circuit, the generation circuit has an output to provide a first control signal that controls the driving of the DC-DC converter, and the first driving circuit has an output to provide a first driving signal, and wherein the first driving circuit is connected to the output of the generation circuit and the second internal electrode of the first semiconductor die.

3. The multi-die module according to claim 2, wherein the first semiconductor die includes a first output transistor having a gate connected to the first driving circuit, and wherein the first output transistor has a drain and a source, and one of the drain and source of the first output transistor is connected to the external electrode.

4. The multi-die module according to claim 2, wherein the first semiconductor die further includes a first external electrode different from the external electrode, and wherein the first external electrode is connected to the output of the first driving circuit.

5. The multi-die module according to claim 2, wherein the first control circuit is connected to the output of the generation circuit and includes a second driving circuit that has an output to provide a second driving signal, and wherein the first and second driving signals activate the first and second control circuits in a first and second activation periods thereof, respectively, and the first activation period does not overlap the second activation period on time axis.

6. The multi-die module according to claim 5, wherein the first semiconductor die includes a first output transistor having a gate connected to the first driving circuit, wherein the first output transistor has a drain and a source, and one of the drain and source of the first output transistor is connected to the external electrode, wherein the first semiconductor die includes a second output transistor having a gate connected to the output of the second driving circuit, and wherein the second output transistor has a drain connected to the external electrode.

7. The multi-die module according to claim 5, wherein the first semiconductor die further includes a second external electrode different from the external electrode, and wherein the second driving circuit has an output connected to the second external electrode.

8. The multi-die module according to claim 1, further including a reference voltage generation circuit disposed on one of the first and second semiconductor dies, wherein the reference voltage generation circuit is configured to supply respective reference voltages to the reference input of the first control circuit and the reference input of the voltage comparison circuit, wherein the multiple internal electrodes of the first semiconductor die includes a third internal electrode, wherein the multiple internal electrodes of the second semiconductor die includes a third internal electrode, wherein the third internal electrode of the first semiconductor die is connected to the third internal electrode of the second semiconductor die, wherein the third internal electrode of the first semiconductor die is connected to at least one of the reference voltage generation circuit and the reference input of the first control circuit, and wherein the third internal electrode of the second semiconductor die is connected to at least one of the reference voltage generation circuit and the reference input of the voltage comparison circuit.

9. The multi-die module according to claim 8, wherein the reference voltage generation circuit is disposed in the first semiconductor die.

10. The multi-die module according to claim 1, further including a selection signal generation circuit disposed in one of the first and second semiconductor dies, wherein the selection signal generation circuit generates a selection signal, and the selection signal has a first value and a second value to cause the DC-DC converter and the linear regulator to operate respectively, and wherein the selection signal is provided to the first and second control circuits.

11. The multi-die module according to claim 10, wherein the selection signal generation circuit is disposed in the first semiconductor die, wherein the internal electrodes of the first semiconductor die includes a fourth internal electrode connected to at least one of the selection signal generation circuit and the first control circuit, wherein the internal electrodes of the second semiconductor die includes a fourth internal electrode connected to the fourth internal electrode of the first semiconductor die, and wherein the second control circuit is connected to the fourth internal electrode of the second semiconductor die.

12. A power supply device including:

a multi-die module according to claim 1; and a capacitor having one end connected to the external electrode of the multi-die module.

13. A power supply device including:

a multi-die module according to claim 1;

an inductor having one end connected to the external electrode of the multi-die module; and a capacitor having one end connected to the external electrode of the multi-die module.

14. A power supply device including:

a multi-die module according to claim 1;

a first external transistor controlled by the first control circuit and having a gate, a source and a drain, wherein the gate of the first external transistor is connected to the multi-die module, one of the source and drain of the first external transistor is connected to the external electrode, and another of the source and drain is connected to a first power supply line; and a capacitor having one end connected to the external electrode of the multi-die module.

15. The power supply device according to claim 14, further including an inductor having one end connected to the external electrode of the multi-die module.

16. The power supply device according to claim 14, further including a second external transistor, wherein the second external transistor is controlled by the first control circuit and has a gate a source and a drain, the gate of the second external transistor is connected to the multi-die module, one of the source and drain of the second external transistor is connected to the external electrode, and another of the source and drain is connected to a second power line different from the first power line.

17. The power supply device according to claim 15, further including a diode having one end connected to the external electrode and another end connected to a second power line different from the first power line.

18. A power supply device including:

a multi-die module including a first semiconductor die and a second semiconductor die; and a first external transistor having a gate, a source and a drain, the gate of the first external transistor being connected to the multi-die module, and one of the source and drain of the first external transistor being connected to a first power supply line, wherein the first semiconductor die includes a first control circuit configured to control at least a DC-DC converter, and has an internal line, multiple internal electrodes, and an external electrode connected to another of the source and drain of the first external transistor, and the first control circuit has a reference input, wherein the multiple internal electrodes of the first semiconductor die includes a first internal electrode that the internal line connects to the external electrode, wherein the second semiconductor die includes a second control circuit configured to control at least a linear regulator, and has multiple internal electrodes, wherein the multiple internal electrodes of the second semiconductor die includes a first internal electrode connected to the first internal electrode of the first semiconductor die, and wherein the second control circuit includes a voltage comparison circuit having a feedback input connected to the first internal electrode of the second semiconductor die, a reference input, and a comparison output.

19. The power supply device according to claim 18, further including a second external transistor, wherein the second external transistor is controlled by the first control circuit and has a gate, a source, and a drain, the gate of the second external transistor is connected to the multi-die module, one of the source and drain of the second external transistor is connected to the external electrode, and another of the source and drain is connected to a second power line different from the first power line.

20. The power supply device according to claim 18, further including an external capacitor having one end connected to the external electrode of external electrode.

* * * * *